United States Patent
Yoshida et al.

(10) Patent No.: US 6,674,215 B1
(45) Date of Patent: Jan. 6, 2004

(54) ELASTIC WAVE DEVICE

(75) Inventors: Kenji Yoshida, Tokyo (JP); Shusou Wadaka, Tokyo (JP); Koichiro Misu, Tokyo (JP); Tsutomu Nagatsuka, Tokyo (JP); Kouji Murai, Tokyo (JP); Masatsune Yamaguchi, Chiba (JP); Kenya Hashimoto, Chiba (JP); Tatsuya Ohmori, Chiba (JP); Koji Ibata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/889,392

(22) PCT Filed: Oct. 18, 2000

(86) PCT No.: PCT/JP00/07239

§ 371 (c)(1),
(2), (4) Date: Jul. 16, 2001

(87) PCT Pub. No.: WO01/37426

PCT Pub. Date: May 25, 2001

(30) Foreign Application Priority Data

Nov. 16, 1999 (JP) .............................. 11-325799

(51) Int. Cl.$^7$ ......................... H01L 41/04; H01L 41/08; H01L 41/18; H02N 2/00
(52) U.S. Cl. .............................. 310/313 R; 310/313 B; 310/334; 310/335
(58) Field of Search ................................ 310/334, 335, 310/313 R, 313 B

(56) References Cited

U.S. PATENT DOCUMENTS 3,828,283 A * 8/1974 Daniel ........................ 333/154

FOREIGN PATENT DOCUMENTS

| EP | 0734120 A1 | * 9/1996 |
| GB | 2288503 A | * 10/1995 |
| JP | 4103723 | 9/1992 |
| JP | A5251982 | 9/1993 |
| JP | 405251982 A | * 9/1993 |
| JP | A5315886 | 11/1993 |
| JP | A7283682 | 10/1995 |
| JP | A9153756 | 6/1997 |
| JP | A9167936 | 6/1997 |

OTHER PUBLICATIONS

Hashimoto et al, "Journal of Institute of Electronics and Communication Engineers of Japan" 84/1, vol. J67–C, No. 1, pp. 158–165 (Jan. 1984).

(List continued on next page.)

Primary Examiner—Nestor Ramirez
Assistant Examiner—Julio Gonzalez Ramirez
(74) Attorney, Agent, or Firm—Birch, Stewart, Kolasch & Birch, LLP

(57) ABSTRACT

There is disclosed an acoustic wave apparatus, constructed in such a manner that a surface rotated in the range of 34° to 41° from a crystal Y axis around the crystal X axis of lithium tantalate is set as the surface of a substrate, a standardized electrode thickness (h/λ) obtained by standardizing a thickness h of an electrode finger constituting at least a part of an interdigital transducer by a wavelength λ of a surface acoustic wave is set to the range of 0.01 to 0.05, and a duty ratio (w/p) of the electrode finger decided based on a width w and an arraying cycle p of the electrode finger is set to the value ranging from 0.6 to just below 1.0.

6 Claims, 7 Drawing Sheets

OTHER PUBLICATIONS

Surface Acoustic Wave Technology, Institute of Electronics and Communication Engineers of Japan, pp. 56–81 (Nov. 1983).

Hashimoto et al, "Recent Research of Elastic Wave Device Technique"; Simulation of SAW Devices By the Discrete Green Function, pp. 649–654 (Mar. 1995).

Hashimoto et al, "Recent Research of Elastic Wave Device Technique"; Simple Mathematical Model for Leaky–SAW Resonator Simulation, pp. 786–791 (Mar. 1995).

Hashimoto, "23th EM Symposium"; Leaky SAW and SH SAW—Comparison with Rayleigh SAW, pp. 93–100 (May 1994).

"Handbook of Elastic Wave Device Technique", pp. 185–205 (Nov. 1991).

"Handbook of Elastic Wave Device Technique", pp. 206–227 (Nov. 1991).

* cited by examiner

US 6,674,215 B1

ELASTIC WAVE DEVICE

This application is the national phase under 35 U.S.C. §371 of PCT International Application No. PCT/JP 00/07239 which has an-International filing date of Oct. 18, 2000, which designated the United States of America and was not published in English.

BACKGROUND OF THE INVENTION

1. Technical Field

The present invention relates to an acoustic wave apparatus for propagating acoustic waves, used for the circuit of a communication equipment, an electronic device or the like.

2. Background Art

Heretofore, in such an acoustic wave apparatus in which a piezoelectric substrate containing lithium tantalate (LiTaO$_3$, referred to as LT hereinafter) has been used, the cut angle θ of the LT substrate has been set equal to 36°. This setting was a result of the calculation that if an electrode was formed on the surface of such a substrate, and the substrate surface was electrically short-circuited, the amount of propagation loss would be reduced to nearly a value of zero.

However, such calculation was made by assuming the establishment of an ideal state where the electrode had no thickness. Consequently, in the actual acoustic wave apparatus comprising an electrode having thickness, there was a possibility that a condition for reducing the amount of propagation loss to a minimum may be different. In addition, the calculation was made by examining the case where the entire surface of the substrate was covered with the electrode. Consequently, in the acoustic wave apparatus comprising electrode fingers cyclically arrayed as in the case of an SAW filter, there was a possibility that a condition for reducing the amount of propagation loss to a minimum might be different.

Thus, in Japanese Patent Application Laid-Open No. 1997-167936 (referred to as a document 1, hereinafter), a condition for reducing the amount of propagation loss to a minimum is examined by taking into consideration the thickness of a grating electrode formed on the surface of the LT substrate. FIG. 1 shows the result of calculating the amount of propagation loss in a ladder surface acoustic wave filter of the document 1 shown in FIG. 7. In the drawing, an ordinate indicates the amount of loss made when a surface acoustic wave (referred to as SAW, hereinafter) is propagated per wavelength (λ), i.e., the amount of loss per wavelength (dB/λ). An abscissa indicates a standardized electrode thickness (h/λ), where the thickness h of the electrode is standardized based on the wavelength λ of SAW.

FIG. 1 shows the case where an LT crystal X-axis direction is set as a SAW propagation direction, a surface perpendicular to a "θ-rotated Y" axis obtained by rotating a crystal Y axis by θ around the crystal X axis, is set as a substrate surface, and a cut angle θ is set in the range of 36° to 46°. The LT substrate having the surface perpendicular to the "θ-rotated Y" axis set as its surface and the crystal X-axis direction set as the SAW propagation direction is represented by θ-rotated Y-cut X-propagation lithium tantalate, abbreviated to θYX-LT, or θYX-LiTaO$_3$. In many cases, the electrode is made of aluminum (Al) or an alloy mainly containing Al.

As shown in FIG. 1, if a standardized electrode thickness (h/λ) is 0, the amount of loss per wavelength (dB/λ) is minimum when a cut angle θ is about 36°. This result coincides with that of the conventional calculation, i.e., if the ideal state of the electrode having no thickness is established, the amount of propagation loss is reduced to nearly a value of zero when a cut angle θ is 36°.

In addition, as shown in FIG. 1, if a cut angle θ is 40°, the amount of loss per wavelength (dB/λ) is minimum when a standardized electrode thickness (h/λ) is about 0.05. If a cut angle θ is 42°, the amount of loss per wavelength (dB/λ) is minimum when a standardized electrode thickness (h/λ) is about 0.075. Accordingly, in the SAW device realized by setting the standardized electrode thickness (h/λ) in a range above 0.05, a cut angle θ for reducing the amount of propagation loss to a minimum resides in a range above 40°.

As apparent from the foregoing discussion made with reference to FIG. 1, it is possible to reduce the amount of propagation loss to a minimum by selecting the proper combination of a standardized electrode thickness (h/λ) with a cut angle θ. As a result, the insertion loss of the SAW device can be reduced. Therefore, in recent years, the LT substrate having a cut angle θ set equal to 42° has been employed.

There are several kinds of acoustic waves. If a cut angle θ is set in the range of about 36° to 46°, and the direction of propagation is a crystal X axis, for example, a surface skimming bulk wave (SSBW), which is a bulk wave propagated along the surface of an LT substrate described in a document: pp. 158–165, "Journal of Institute of Electronics and Communication Engineers of Japan", Vo 1. J67-C, No. 1, January 1984 (referred to as a document 2, hereinafter), and a leaky surface acoustic wave (LSAW) are propagated. In the present application, these waves are generically termed as SAW, except when the waves are distinguished from each other.

FIG. 2 is an upper surface view showing the constitution of the SAW filter, which is one type of an acoustic wave apparatus. In the drawing, a reference numeral 1 denotes an LT substrate made of a piezoelectric material; 3 an electrode finger; 4 a bonding pad; 5 an input side interdigital transducer (IDT) for performing electric—surface acoustic wave energy conversion; 6 an output side IDT for performing surface acoustic wave—electric energy conversion; 7 an input terminal; and an 8 an output terminal. W 0 represents a maximum value of the length of a portion intersected by the electrode finger 3.

FIG. 3 is a sectional view of the SAW filter shown in FIG. 2. In the drawing, a code w represents a width of the electrode finger 3; p an arraying cycle of electrode fingers 3; and h a thickness of the electrode finger 3.

Next, the operation of the SAW filter will be described.

An electric signal applied to the input terminal 7 forms an electric field at the intersection of each electrode finger 3 of the input side IDT 5. In this case, as the LT substrate 1 is made of the piezoelectric material, the electric field causes distortion. If the input signal has a frequency f, the strain that has been generated is vibrated at the frequency f, converting the signal into SAW. This SAW is then transmitted in a direction perpendicular to the electrode finger 3. At the output side IDT 6, the SAW is converted back into the electric signal. The conversion of the electric signal into the SAW, and the conversion of the SAW into the electric signal are reversible to each other.

If a cut angle θ is about 36°, and the propagation direction of the SAW is in a crystal X-axis direction, as described in the document 2, the displacement component of the SAW has a direction parallel to the electrode finger 3, and the surface of the LT substrate 1. Such a displacement component depends on the cut angle θ of the cut surface of the LT substrate 1 and the propagation direction of the SAW.

The SAW excited by the input side IDT 5 is propagated toward the output side IDT 6. However, if there is propagation loss in the LT substrate 1, the power of the SAW having reached the output side IDT 6 is smaller than that of the SAW immediately after its excitation by the input side IDT 5. The amount of the loss is approximately equal to a value obtained by multiplying a distance between the centers of the input side IDT 5 and the output side IDT 6 standardized based on the wavelength λ of the SAW by an attenuation constant α.

Thus, assuming that the distances of the input side IDT 5 and the output side IDT 6 are equal to each other, as the amount of propagation loss in the LT substrate 1 is increased, the amount of insertion loss for the SAW filter is larger. As described in a document: pp. 56 to 81, "Surface Acoustic Wave Engineering", Institute of Electronics and Communication Engineers of Japan, issued by Corona Inc., November 1983, since the wavelength λ of the SAW is double the arraying cycle p of the electrode fingers 3, the amount of loss generated following propagation is approximately equal to a value, which is obtained by multiplying a numerical value half an average value of the numbers of electrode fingers 3 constituting the input side IDT 5 and the output side IDT 6 by an attenuation constant α.

For example, as shown in FIG. 2, assuming that each of the input side IDT 5 and the output side IDT 6 has 7 electrode fingers 3, and the input side IDT 5 and the output side IDT 6 are disposed close to each other, the amount of loss generated following propagation is equal to a value, which is about 3 to 4 times larger than the attenuation constant α. As an example, if an attenuation constant α is 0.02 (dB/λ), then the amount of loss following propagation takes a value set in the range of 0.06 to 0.08 dB.

As apparent from the foregoing, in order to realize a low-loss SAW device, it is important to use an LT substrate 1 having a small amount of propagation loss. Heretofore, in the acoustic wave apparatus of the foregoing type, a cut angle θ set in a range above 36° has been employed.

As described above, the propagation loss greatly affects the insertion loss of the SAW filter. However, the propagation loss is not the only factor that affects the insertion loss of the SAW filter. As material constants for representing the characteristics of the LT substrate 1, in addition to the propagation loss, there are an electromechanical coupling coefficient $k^2$ regarding conversion efficiency between the electric signal and the SAW, a capacitance C0 regarding the impedance of the input or output side IDT 5 or 6, the propagation velocity Vs of the SAW, and so on. Among these constants, the electromechanical coupling coefficient $k^2$ is particularly important, because it decides the insertion loss or the pass band width of the SAW filter.

For the acoustic wave apparatus using a pure surface acoustic wave bringing about no propagation loss in principle, such as a Rayleigh wave, Bleustein-Gulyaev-Shimizu (BGS) wave or the like, optimal designing conditions were known. However, for the acoustic wave apparatus using LSAW or SSBW, no specific conditions were known.

As described above, the conventional acoustic wave apparatus of the foregoing type has been used under the condition for minimizing the propagation loss. However, since the electromechanical coupling coefficient $k^2$ for greatly affecting the characteristics of the acoustic wave apparatus has not been used under any optimal conditions, deterioration has inevitably occurred in the insertion loss or the band width of the acoustic wave apparatus.

The present invention was made to solve the foregoing problems, and it is an object of the invention to provide an acoustic wave apparatus with lower loss characteristics and wider band than the conventional acoustic wave apparatus of the foregoing type.

DISCLOSURE OF THE INVENTION

In accordance with the present invention, there is provided an acoustic wave apparatus, comprising: a piezoelectric substrate mainly containing lithium tantalate; and an interdigital transducer including a conductor formed on the substrate. In this case, a surface rotated in the range of 34° to 41° from a crystal Y axis around a crystal X axis of the lithium tantalate is set as the surface of the substrate, a standardized electrode thickness (h/λ) obtained by standardizing a thickness h of an electrode finger constituting the interdigital transducer by a wavelength λ of a surface acoustic wave is set in the range of 0.01 to 0.05, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; and an interdigital transducer including a conductor formed on the substrate. In this case, a surface rotated in the range of 35° to 42° from a crystal Y axis around a crystal X axis of the lithium tantalate is set as the surface of the substrate, a standardized electrode thickness (h/λ) obtained by standardizing a thickness h of an electrode finger constituting the interdigital transducer by a wavelength λ of a surface acoustic wave is set in the range of 0.05 to 0.075, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; and an interdigital transducer including a conductor formed on the substrate. In this case, a surface rotated in the range of 36° to 43° from a crystal Y axis around a crystal X axis of the lithium tantalate is set as a surface of the substrate, a standardized electrode thickness (h/λ) obtained by standardizing a thickness h of an electrode finger constituting the interdigital transducer by a wavelength λ of a surface acoustic wave is set in the range of 0.075 to 0.1, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band than the conventional apparatus can be realized.

In accordance with the invention, there is provided an acoustic wave apparatus, comprising: a piezoelectric substrate mainly containing lithium tantalate; an interdigital transducer including a conductor formed on the substrate; and a reflector including a conductor formed on the substrate. In this case, a surface rotated in the range of 34° to 41° from a crystal Y axis around a crystal X axis of the lithium tantalate is set as a surface of the substrate, a standardized electrode thickness (h/λ) obtained by standardizing a thickness h of an electrode finger constituting at least a part of the reflector by a wavelength λ of a surface acoustic wave is set in the range of 0.01 to 0.05, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; an interdigital transducer including a conductor formed on the substrate; and a reflector including a conductor formed on the substrate. In this case, a surface rotated in the range of 35° to 42° from a crystal Y axis around a crystal X axis of the lithium tantalate is set as a surface of the substrate, a standardized electrode thickness (h/λ) obtained by standardizing a thickness h of an electrode finger constituting at least a part of said reflector by a wavelength λ of a surface acoustic wave is set in the range of 0.05 to 0.075, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; an interdigital transducer including a conductor formed on the substrate; and a reflector including a conductor formed on the substrate. In this case, a surface rotated in the range of 36° to 43° from a crystal Y axis around a crystal X axis of the lithium tantalate is set as a surface of the substrate, a standardized electrode thickness (h/λ) obtained by standardizing a thickness h of an electrode finger constituting at least a part of the reflector by a wavelength λ of a surface acoustic wave is set in the range of 0.075 to 0.1, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; and an interdigital transducer including a conductor formed on the substrate. In this case, a surface rotated in the range of 34° to 41° from a crystal Y axis around a crystal X axis of the lithium tantalate is set as a surface of the substrate, a standardized electrode thickness (h/λ) obtained by standardizing a thickness h of an electrode finger constituting a part of the interdigital transducer by a wavelength λ of a surface acoustic wave is set in the range of 0.01 to 0.05, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; and an interdigital transducer including a conductor formed on the substrate. In this case, a surface rotated in the range of 35° to 42° from a crystal Y axis around a crystal X axis of the lithium tantalate is set as a surface of the substrate, a standardized electrode thickness (h/λ) obtained by standardizing a thickness h of an electrode finger constituting a part of the interdigital transducer by a wavelength λ of a surface acoustic wave is set in the range of 0.05 to 0.75, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; and an interdigital transducer including a conductor formed on the substrate. In this case, a surface rotated in the range of 36° to 43° from a crystal Y axis around a crystal X axis of the lithium tantalate is set as a surface of the substrate, a standardized electrode thickness (h/λ) obtained by standardizing a thickness h of an electrode finger constituting a part of the interdigital transducer by a wavelength λ of a surface acoustic wave is set in the range of 0.075 to 0.1, and a duty ratio (w/p) of the electrode finger decided based on a width w and an arraying cycle p of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; an interdigital transducer including a conductor formed on the substrate; and a reflector including a conductor formed on the substrate. In this case, a surface rotated in the range of 34° to 41° from a crystal Y axis around a crystal X axis of the lithium tantalate is set as a surface of the substrate, a standardized electrode thickness (h/λ) obtained by standardizing a thickness h of a part of an electrode finger constituting a part of the reflector by a wavelength λ of a surface acoustic wave is set in the range of 0.01 to 0.05, and a duty ratio (w/p) of a part of the electrode finger decided based on a width w and an arraying cycle p of a part of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; an interdigital transducer including a conductor formed on the substrate; and a reflector including a conductor formed on the substrate. In this case, a surface rotated in the range of 35° to 42° from a crystal Y axis around a crystal X axis of the lithium tantalate is set as a surface of the substrate, a standardized electrode thickness (h/λ) obtained by standardizing a thickness h of a part of an electrode finger constituting a part of the reflector by a wavelength λ of a surface acoustic wave is set in the range of 0.05 to 0.075, and a duty ratio (w/p) of a part of the electrode finger decided based on a width w and an arranging cycle of a part of the electrode finger is set to the value ranging from 0.6 to just below 1.0.

Thus, an acoustic wave apparatus with lower loss characteristics and wider band characteristics than the conventional apparatus can be realized.

In accordance with the invention, there is provided an acoustic wave apparatus, comprising: a piezoelectric substrate mainly containing lithium tantalate; an interdigital transducer including a conductor formed on the substrate; and a reflector including a conductor formed on the substrate. In this case, a surface rotated in the range of 36° to 43° from a crystal Y axis around a crystal X axis of the lithium tantalate is set as a surface of the substrate, a standardized electrode thickness (h/λ) obtained by standardizing a thickness h of a part of an electrode finger constituting a part of the reflector by a wavelength λ of a surface acoustic wave is set in the range of 0.075 to 0.1, and a duty ratio (w/p) of a part of the electrode finger decided based on a width w and an arraying cycle p of a part of the electrode finger is set to the value ranging from 0.6 to just below 1.0.

Thus, an acoustic wave apparatus with lower loss characteristics and wider band characteristics than the conventional apparatus can be realized.

BEST MODE FOR CARRYING OUT THE INVENTION

Several embodiments for carrying out best the present invention are now explained in detail with reference to attached drawings.

[First Embodiment]

Figure 4:
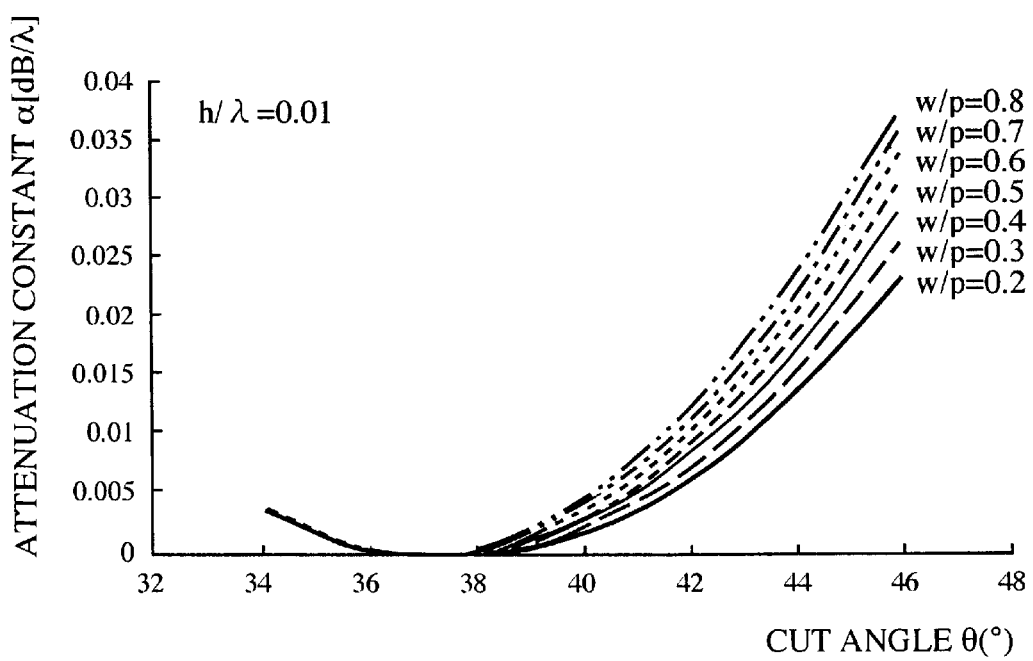
FIG. 4 is a view showing a result of calculating an attenuation constant when a standardized electrode thickness is set equal to 0.01, according to a first embodiment of the present invention.

FIG. 4 is a view showing the result of calculating an attenuation constant α when a standardized electrode thickness (h/λ) is 0.01. In the drawing, an ordinate indicates an attenuation constant α (dB/λ); and an abscissa a cut angle θ of an LT substrate. As in the case shown in FIG. 1, the crystal X-axis direction of the LT substrate is set as the propagation direction of SAW, and a surface perpendicular to the axis of rotating a crystal Y axis by θ around the crystal X axis, i.e., the surface of rotating the crystal Y axis by θ around the crystal X axis, is set as the surface of the LT substrate.

Figure 3:
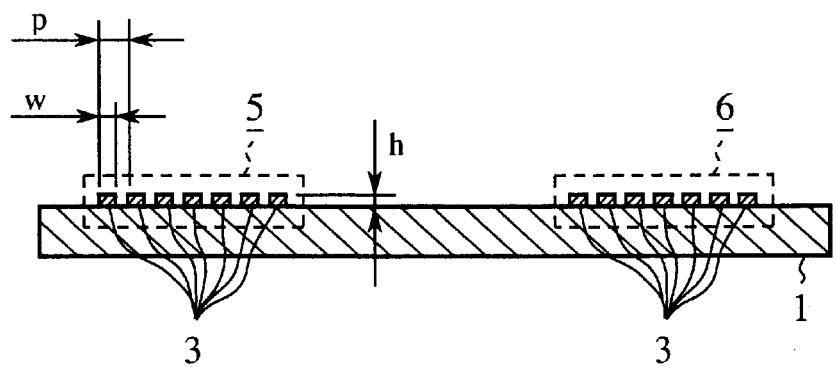
FIG. 3 is a sectional view of the SAW filter shown in FIG. 2.

In the described case, calculation is made as to the propagation characteristic of SAW when electrode fingers each having a width w like that shown in FIG. 3 are endlessly arrayed at an arraying cycle p. FIG. 4 specifically shows the results of calculation made by changing the duty ratio (w/p) of the electrode finger decided based on the width w and the arraying cycle p of the electrode finger from 0.2 to 0.8 each by 0.1.

Figure 5:
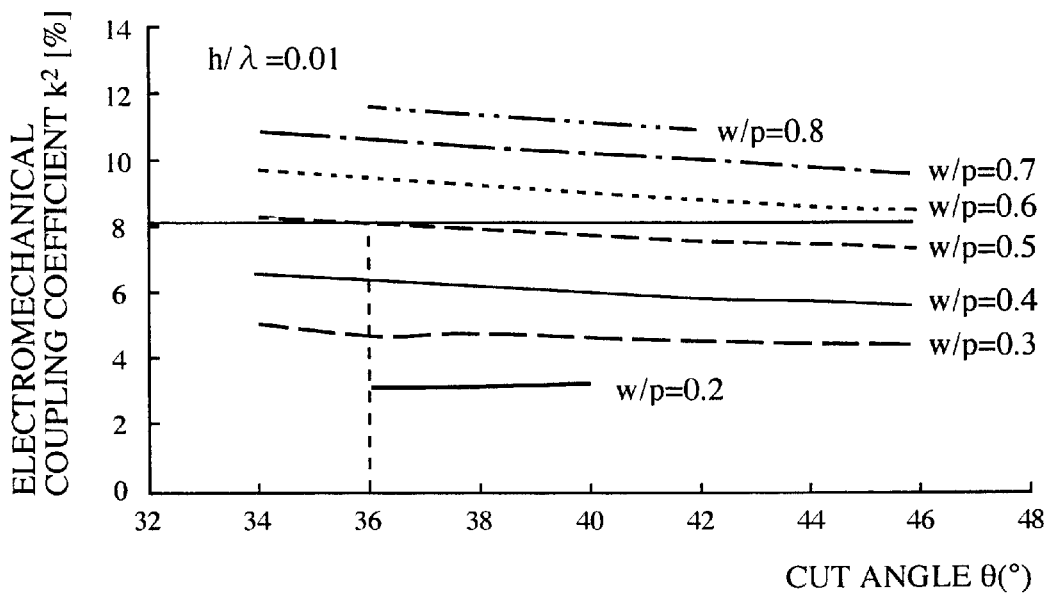
FIG. 5 is a view showing a result of calculating an electromechanical coupling coefficient when the standardized electrode thickness is equal to 0.01, according to the first embodiment of the invention.

FIG. 5 is a view showing the result of calculating an electromechanical coupling coefficient $k^2$ when a standardized electrode thickness (h/λ) is 0.01. In the drawing, an ordinate indicates an electromechanical coupling coefficient $k^2$; and an abscissa a cut angle θ of the LT substrate as in the case shown in FIG. 4. FIG. 5 shows the results of calculation made by changing the duty ratio (w/p) based on the same values as those shown in FIG. 4.

The results of calculation shown in FIGS. 4 and 5 are based on the methods of analysis using discrete Green function respectively described in, for example, a document: pp. 649 to 654, "Recent Studies on Acoustic Wave Device Technology-Committee Report-, March, 1995, by Acoustic Wave Device Technology 150th Committee of Japan Society for the Promotion of Science (referred to as a document 4, hereinafter), a document: pp. 786 to 791 of the same (document 5, hereinafter), and a document: pp. 93 to 100, 23rd EM Symposium, May, 1994 (document 6, hereinafter). The back scattering effect of a program (FEMSDA) described in the document 5 is excluded in the results of calculation.

Similarly to FIGS. 4 and 5, FIGS. 6 and 7 show the results of calculation each made when a standardized electrode thickness (h/λ) is 0.05. The value 0.05 of the standardized electrode thickness (h/λ) is used relatively frequently in the SAW device of a GHz band.

Figure 6:
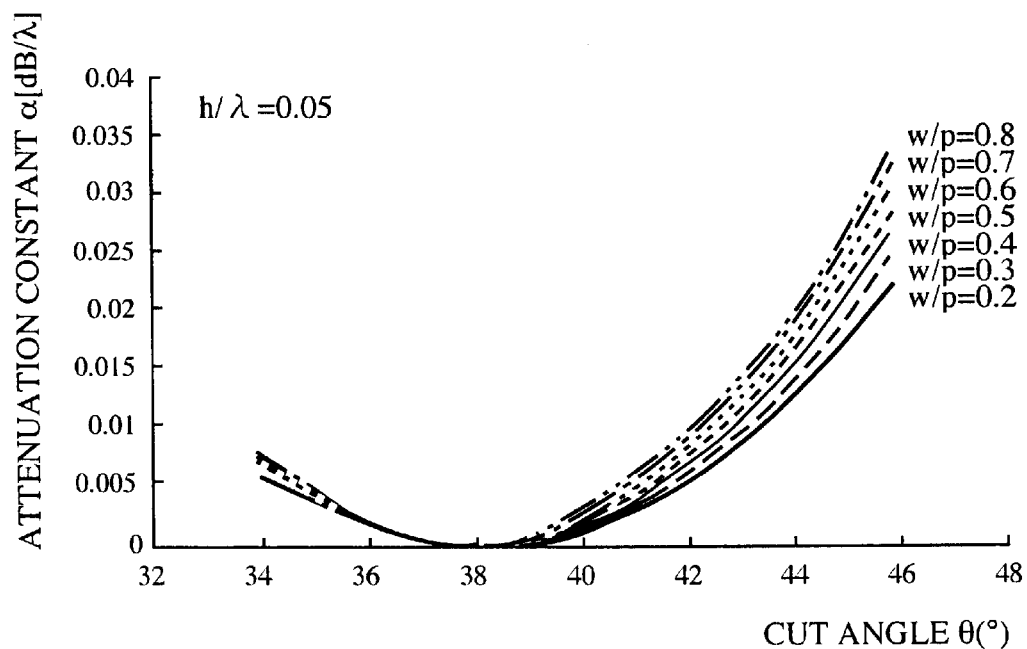
FIG. 6 is a view showing a result of calculating an attenuation constant when a standardized electrode thickness is set equal to 0.05, according to the first embodiment of the invention.
Figure 7:
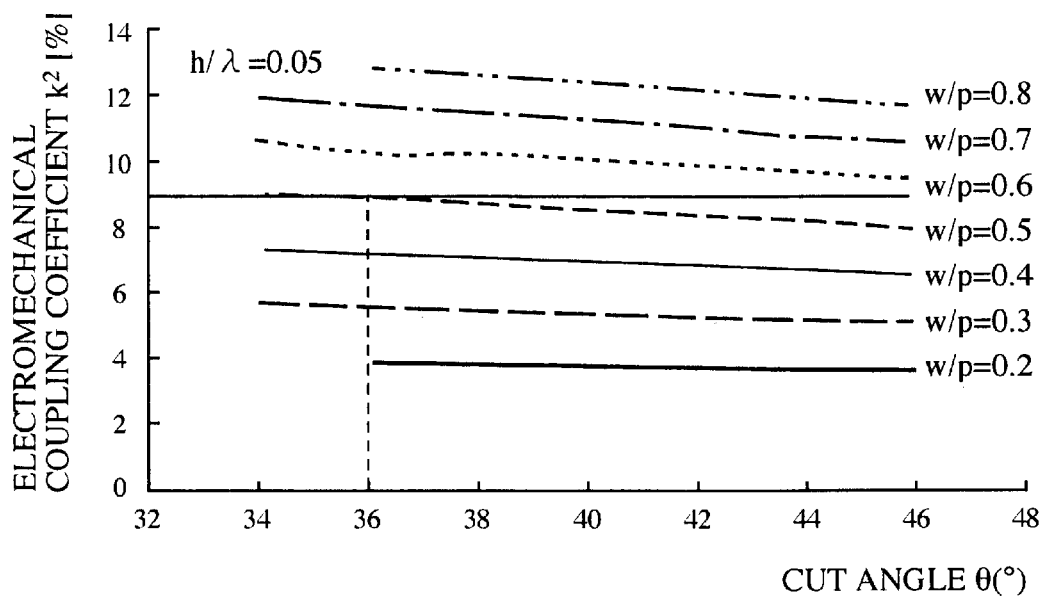
FIG. 7 is a view showing a result of calculating an electromechanical coupling coefficient when the standardized electrode thickness is equal to 0.05, according to the first embodiment of the invention.

Referring to FIG. 6, a cut angle θ with respect to a minimum attenuation constant α is shown to be larger than that shown in FIG. 4. In FIG. 7, however, if a cut angle θ is selected for a smaller attenuation constant α, an electromechanical coupling coefficient $k^2$ is smaller. In other words, as shown in FIG. 6, an attenuation constant α takes a minimum value when a cut angle θ is about 38°. But an electromechanical coupling coefficient $k^2$ takes a larger value when a cut angle θ is lower than 38°.

Figure 8:
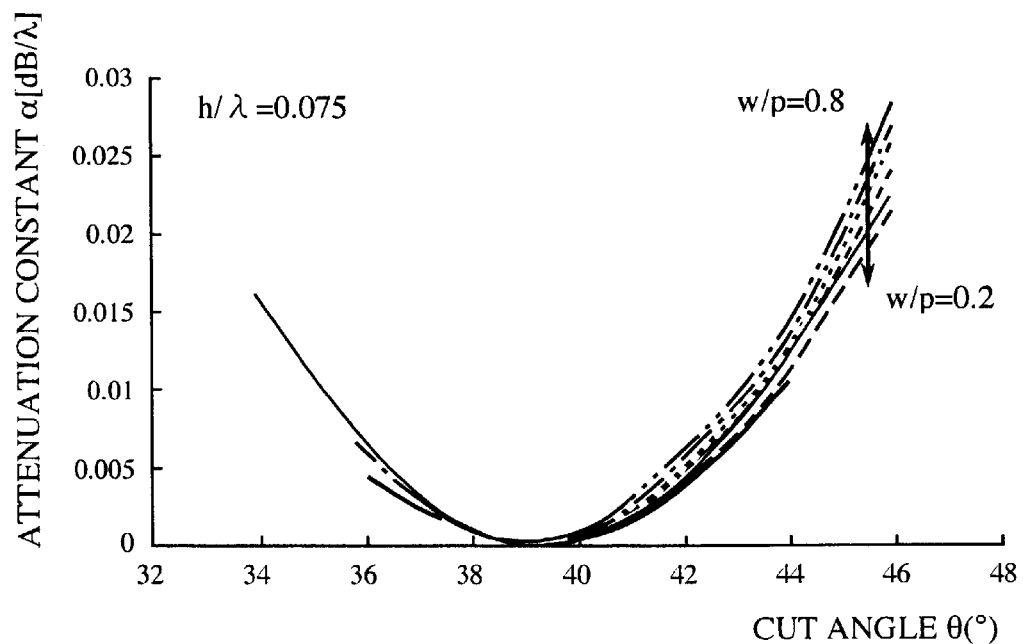
FIG. 8 is a view showing a result of calculating an attenuation constant when a standardized electrode thickness is set equal to 0.075, according to the first embodiment of the invention.
Figure 9:
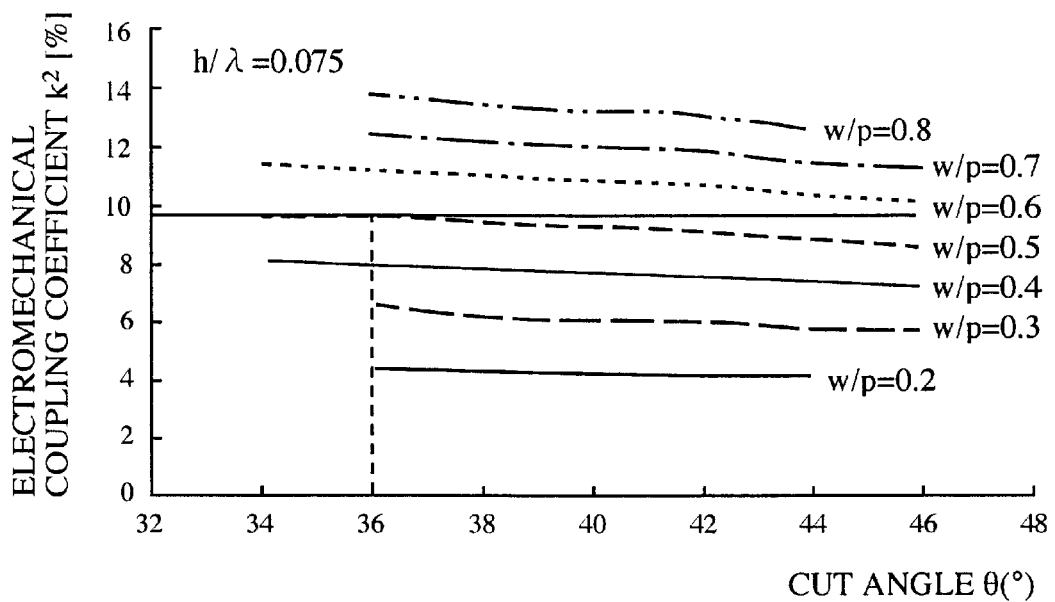
FIG. 9 is a view showing a result of calculating an electromechanical coupling coefficient when the standardized electrode thickness is equal to 0.075, according to the first embodiment of the invention.

Similarly to FIGS. 4 and 5, or FIGS. 6 and 7, FIGS. 8 and 9 show the results of calculation each made when a standardized electrode thickness (h/λ) is 0.075. Referring to FIG. 8, a cut angle θ with respect to a minimum attenuation constant α is shown to be larger than that shown in FIG. 6. An attenuation constant α is minimum when a cut angle θ is about 39°. In FIG. 9, however, if a cut angle θ is selected for a smaller attenuation constant α, an electromechanical coupling coefficient $k^2$ is smaller. In other words, an electromechanical coupling coefficient $k^2$ takes a larger value when a cut angle θ is lower than 39°.

Figure 10:
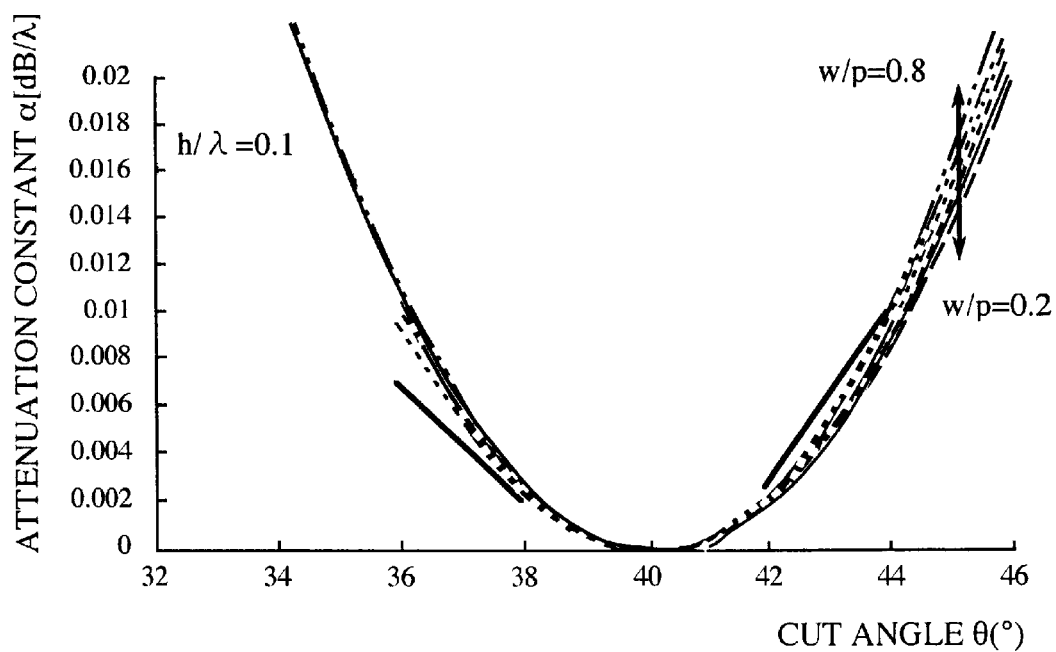
FIG. 10 is a view showing a result of calculating an attenuation constant in an LT substrate when a standardized electrode thickness is set equal to 0.1, according to the first embodiment of the invention.
Figure 11:
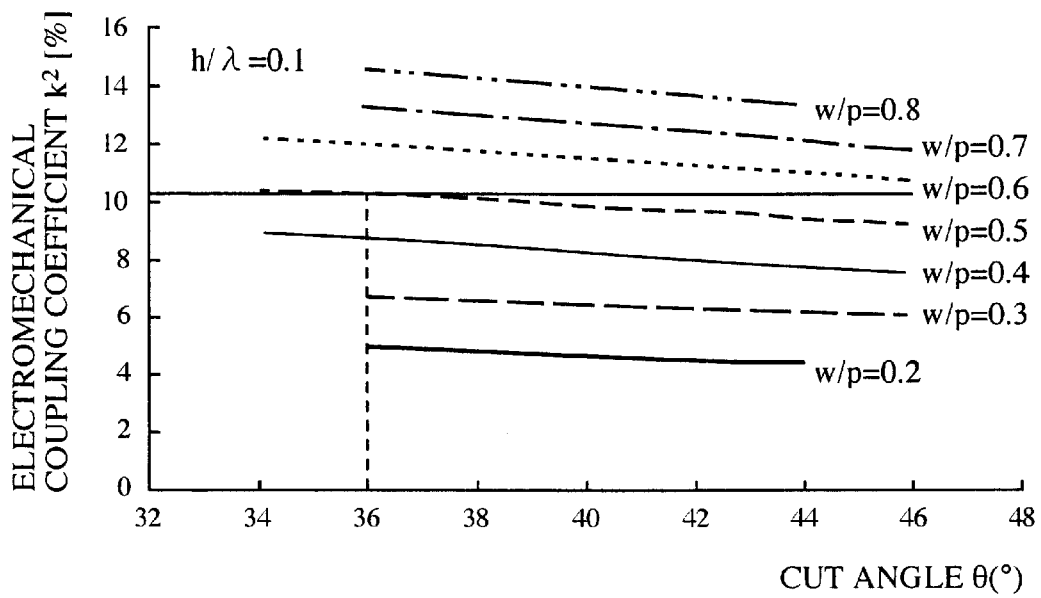
FIG. 11 is a view showing a result of calculating an electromechanical coupling coefficient in the LT substrate when the standardized electrode thickness is equal to 0.1, according to the first embodiment of the invention.

Similarly to FIGS. 4 and 5, FIGS. 6 and 7, or FIGS. 8 and 9, FIGS. 10 and 11 show the results of calculation each made when a standardized electrode thickness (h/λ) is 0.1. Referring to FIG. 10, a cut angle θ with respect to a minimum attenuation constant α is shown to be larger than that shown in FIG. 8. An attenuation constant α is minimum when a cut angle θ is about 40°. In FIG. 11, however, if a cut angle θ is selected for a smaller attenuation constant α, an electromechanical coupling constant $k^2$ is smaller. In other words, an electromechanical coupling coefficient $k^2$ takes a larger value when a cut angle θ is lower than 40°.

Figure 1:
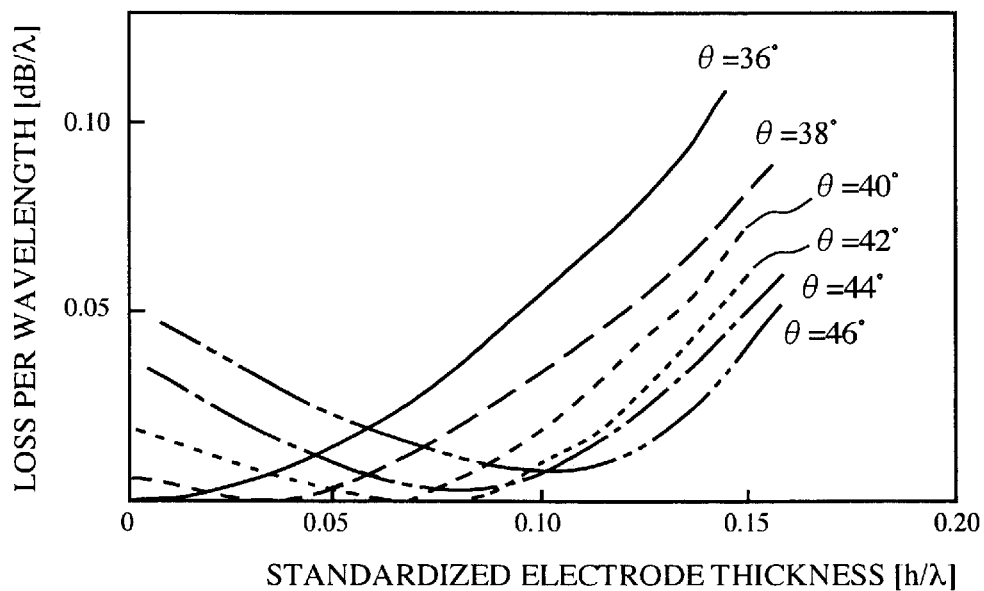
FIG. 1 is a view showing a result of calculating an attenuation constant, described in Japanese Patent Application Laid-Open No. 1997-167936.

In FIG. 6, for example, if a duty ratio (w/p) is 0.5, an attenuation constant α takes a minimum value substantially equal to 0 when a cut angle θ is about 38°. However, in the case of the calculation result for the conventional acoustic wave apparatus of such a type, shown in FIG. 1, if a standardized electrode thickness (h/λ) is 0.05, an attenuation constant α takes a minimum value equal to 0 when a cut angle θ is about 40°. This is attributed to the fact that the calculation result of FIG. 1 is for the ladder surface acoustic wave filter according to the document 1, and is different from the calculation result for the acoustic wave apparatus constructed by arraying the electrode fingers at an endless cycle.

Figure 12:
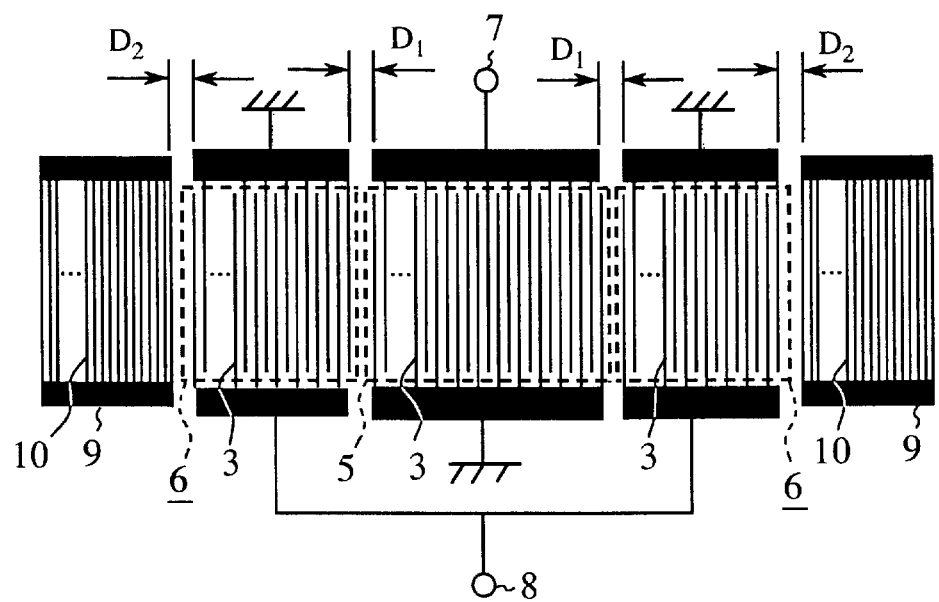
FIG. 12 is a view showing a pattern of a mode-coupled SAW resonant filter.

FIG. 12 shows the pattern of a mode-coupled SAW resonant filter, used to determine the effects of the calculation results shown in FIGS. 4 to 11 on the SAW filter. In the drawing, a reference numeral 5 denotes an input side IDT. There are 31 electrode fingers 3 provided. A reference numeral 6 denotes an output side IDT. Two output sides IDT 6 are electrically connected in parallel with each other. One side of the output side IDT 6 has 18 electrode fingers 3, while the other side has 20 electrode fingers 3. A reference numeral 9 denotes a grating reflector, which has 120 electrode fingers (i.e., strips) 10 in one side. The line widths of the electrode fingers 3 of the input and output side IDT 5 and 6 are all equal to one another at wi, and also arraying cycles all equal to one another at pi.

The arraying cycle pg of the electrode fingers 10 of the grating reflector 9 shown in FIG. 12 is set at pg=1.0251 pi, different from those of the input and output side IDT 5 and 6. The duty ratio (wg/pg) of the electrode fingers 10 of the grating reflector 9 is equal to that (wi/pi) of the electrode fingers 3 of each of the input and output side IDT 5 and 6. Hereinafter, these duty ratios (wi/pi) and (wg/pg) are generically referred to as a duty ratio (w/p).

Distances D1 and D2 are respectively 2.5 pi and 0.25 pi. A maximum intersection width is 360 μm.

Figure 13:
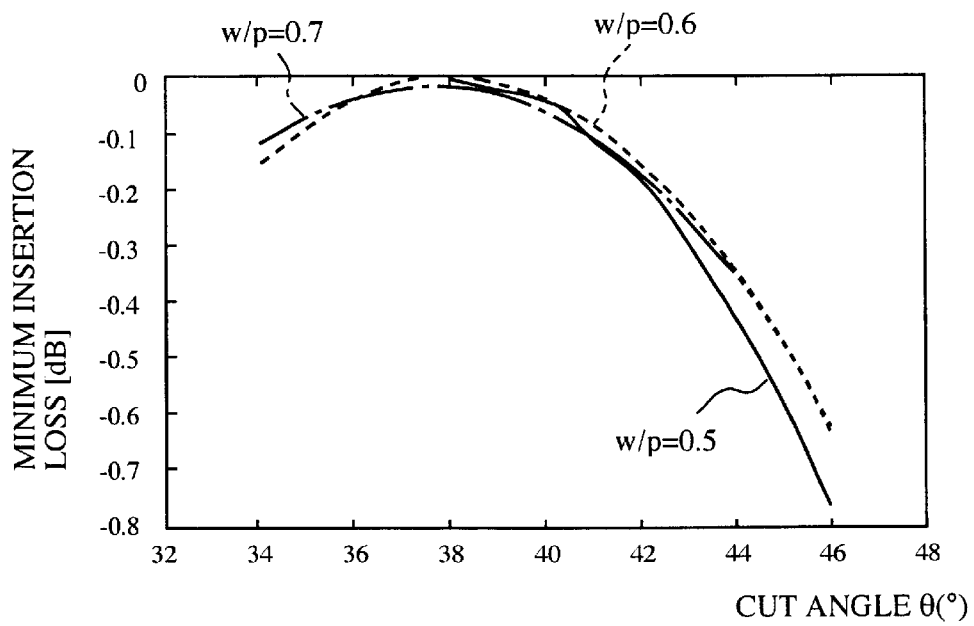
FIG. 13 is a view showing a result of calculating a minimum insertion loss value of the mode-coupled SAW resonant filter shown in FIG. 12.

FIG. 13 shows the result of calculating a minimum insertion loss value for the SAW filter shown in FIG. 12. Specifically, FIG. 13 shows the results of calculation made by changing duty ratios (w/p) from 0.5 to 0.7 each by 0.1, when a standardized electrode thickness (h/λ) is 0.05 for each of the electrode fingers 3 and 10 respectively of the input and output side IDT 5 and 6 and the grating reflector 9.

For the calculation, for example, a document: pp. 185 to 205, "Acoustic Wave Device Technology Handbook", November 1991, by Acoustic Wave Device Technology 150th Committee of Japan Society for the Promotion of Science (referred to as a document 7, hereinafter) is available. In the described case, specifically, a 2nd equivalent circuit model by Smith described therein (FIG. 3.76, p. 188 of the document 7) is used for the input and output side IDT 5 and 6.

For the grating reflector 9, for example, a document: pp. 206 to 227, "Acoustic Wave Device Technology Handbook", November 1991, by Acoustic Wave Device Technology 150th Committee of Japan Society for the Promotion of Science (referred to as a document 8, hereinafter) is available. In the described case, specifically, a distributed constant equivalent circuit described therein (right side of FIG. 3.134, p. 221 of the document 8) is used.

The change of a cut angle θ or a duty ratio (w/p) causes a change in the propagation velocity Vs of SAW. In the described case, however, calculation is made by changing an arraying cycle pi in such a way as to set a center frequency f0 of each of the input and output side IDT 5 and 6 equal to 965 MHz. In addition, the calculation is made by taking into consideration not only the changes of an attenuation constant α and an electromechanical coupling coefficient $k^2$, but also the changes of material constants for the SAW propagation velocity Vs, a capacitance C0, a reflection coefficient C1, and so on.

Referring to FIG. 13, a value of insertion loss is shown to be minimum when a cut angle θ is about 38°, which is smaller than that used in the conventional acoustic wave apparatus of such a type when a cut angle θ is 36° or 42°. Referring to FIG. 6, an attenuation constant α is shown to be minimum when a cut angle θ is 38°. This explains why the value of insertion loss is minimum when the cut angle θ is about 38°. It can therefore be understood that the attenuation constant α greatly affects the amount of insertion loss.

Figure 14:
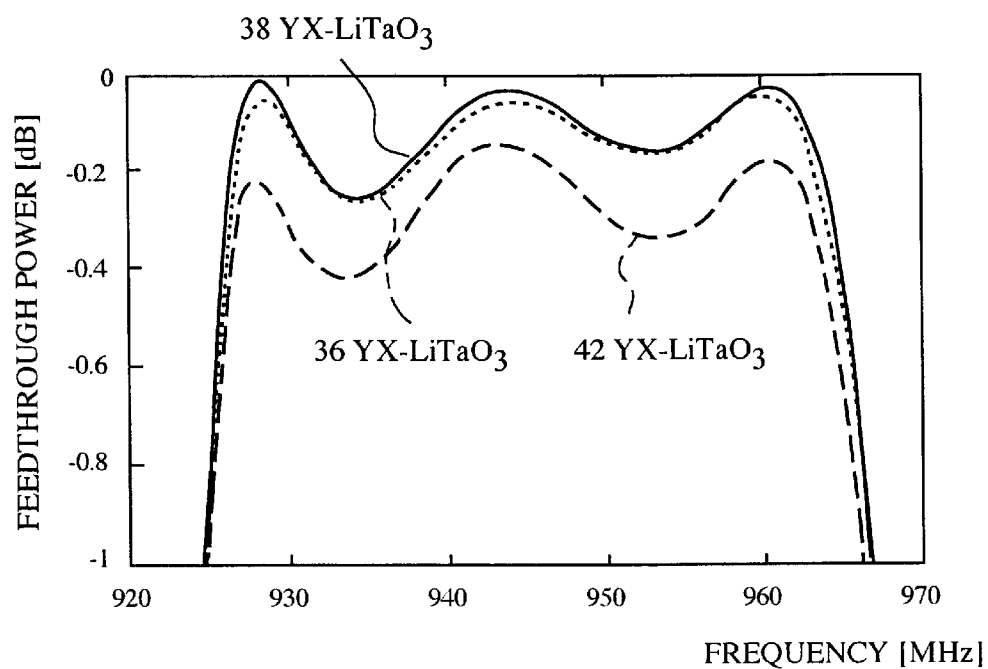
FIG. 14 is a view showing a result of calculating feedthrough power of the mode-coupled SAW resonant filter shown in FIG. 12.

FIG. 14 shows the result of calculating feedthrough power for the SAW filter shown in FIG. 12. Specifically, FIG. 14 shows the results of calculation made by changing cut angles θ to 36°, 38° and 42°, when a standardized electrode thickness (h/λ) of each of the electrode fingers 3 and 10 respectively of the input and output side IDT 5 and 6 and the grating reflector 9 is 0.05, and a duty ratio (w/p) is 0.7.

In addition, the calculation is made by assuming that when a cut angle θ is 36°, an acoustic velocity Vs is 4083.4 (m/s), an attenuation constant α 0.01749 (dB/λ), a capacitance C0 304 (pF/m) per electrode finger, and an electromechanical coupling coefficient $k^2$ 11.7%; when a cut angle θ is 38°, an acoustic velocity Vs is 4085.6 (m/s), an attenuation constant α $8\times10^{-6}$ (dB/λ), a capacitance C0 304 (pF/m) per electrode finger, and an electromechanical coupling coefficient $k^2$ 11.4%; and when a cut angle θ is 42°, an acoustic velocity Vs is 4088.3 (m/s), an attenuation constant α 0.00833 (dB/λ), a capacitance C0 302 (pF/m) per electrode finger, and an electromechanical coupling coefficient $k^2$ 11.0%.

As shown in FIG. 14, feedthrough power is only slightly lower when the cut angle θ is 36° compared with that when the cut angle θ is 38°. However, when the cut angle θ is 42°, feedthrough power is lower by 0.1 dB or more compared with that when the cut angle θ is 38°. As shown in FIG. 6, an attenuation constant α is larger when the cut angle θ is 36° or 42°, compared with that when the cut angle θ is 38°. As shown in FIG. 7, an electromechanical coupling coefficient $k^2$ is larger when the cut angle θ is 36°, compared with that when the cut angle θ is 38°. When the cut angle θ is 42°, an electromechanical coupling coefficient $k^2$ is smaller compared with that when the cut angle θ is 38°. The only slightly lower level of the feedthrough power when the cut angle θ is 36° compared with that when the cut angle θ is 38° can be attributed to the fact that when the cut angle θ is 36°, not only the attenuation constant α but also the electromechanical coupling coefficient $k^2$ are larger than those when the cut angle θ is 38°. The lower level of the feedthrough power by 0.1 dB or more when the cut angle θ is 42° compared with that when the cut angle θ is 38° can be attributed to the fact that when the cut angle θ is 42°, the attenuation constant α is larger than that when the cut angle θ is 38°, but the electromechanical coupling coefficient $k^2$ is smaller. Accordingly, it can be understood that the electromechanical coupling coefficient $k^2$ also affects the amount of insertion loss greatly.

As can be understood from FIG. 7, the increase of the duty ratio (w/p) brings about a larger electromechanical coupling coefficient $k^2$, reducing the amount of insertion loss and widening a pass band width. Even if the larger attenuation constant α increases the amount of loss following propagation, a corresponding increase if made in the electromechanical coupling coefficient $k^2$ results in a reduction in the amount of insertion loss.

As shown in FIG. 4, the attenuation constant α takes a minimum value when the cut angle θ is about 37° and, by setting the cut angle θ in the range of 34° to 40°, the attenuation constant α can be limited to 0.005 (dB/λ). In addition, as shown FIG. 6, the attenuation constant α takes a minimum value when the cut angle θ is about 38° and, by setting the cut angle θ in the range of 35° to 41°, the attenuation constant α can be limited to 0.005 (dB/λ).

As shown in FIGS. 5 and 7, when the cut angle θ is set in the range of 34° to 41°, the cut angle θ is 36° or 42° if the duty ratio (w/p) is 0.6 or higher. The electromechanical coupling coefficient $k^2$ is larger than that in the conventional case having the duty ratio (w/p) of 0.5. In the case having a large standardized electrode thickness (h/λ) shown in FIG. 7, compared with that shown in FIG. 5, the electromechanical coupling coefficient $k^2$ is larger under equal cut angles θ and equal duty ratios (w/p). There have been no reports made hitherto regarding the result of calculating an electromechanical coupling coefficient based on consideration given to the duty ratio. Thus, in the described case, a general duty ratio 0.5 was used as a conventional duty ratio. The same applies hereinafter.

As described above, according to the first embodiment, the cut angle θ of the LT substrate is set in the range of 34° to 41°, the electrode thickness of each of the electrode fingers 3 and 10 respectively of the input and output side IDT 5 and 6 and the grating reflector 9 is set in the range of 0.01 to 0.05 with respect to a wavelength of SAW, and the duty ration (w/p) of the electrode fingers 3 and 10 respectively of the input and output side IDT 5 and 6 and the grating reflector 9 is set to the value ranging from 0.6 to just below 1.0. Thus, it is possible to realize an acoustic wave apparatus with lower loss characteristics and wider band characteristics as compared with the conventional acoustic wave apparatus of such a type.

Such an advantage can be obtained not only when the input and output side IDT 5 and 6 and the grating reflector 9 all satisfy the above-described conditions, but also when only one of the components satisfies the conditions.

For example, a similar advantage can be obtained when only the input side IDT 5 satisfies the conditions, i.e., when the cut angle θ of the LT substrate is set in the range of 34° to 41°, the electrode thickness of the electrode finger 3 of the input side IDT 5 is set in the range of 0.01 to 0.05 with respect to a wavelength of SAW, and the duty ratio (w/p) of the electrode finger 3 of the input side IDT 5 is set to the value ranging from 0.6 to just below 1.0.

Similarly, a similar advantage can be obtained when only the output side IDT 6 satisfies the conditions, i.e., when the cut angle θ of the LT substrate is set in the range of 34° to 41°, the electrode 3 thickness of the electrode finger 3 of the output side IDT 6 is set in the range of 0.01 to 0.05 with respect to a wavelength of SAW, and the duty ratio (w/p) of the electrode finger 3 of the output side IDT 6 is set to the value ranging from 0.6 to just below 1.0.

Likewise, a similar advantage can be obtained when only the grating reflector 9 satisfies the conditions, i.e., when the cut angle θ of the LT substrate is set in the range of 34° to 41°, the electrode thickness of the electrode finger 10 of the grating reflector 9 is set in the range of 0.01 to 0.05 with respect to a wavelength of SAW, and the duty ratio (w/p) of the electrode finger 10 of the grating reflector 9 is set to the value ranging from 0.6 to just below 1.0.

In addition, the foregoing advantage can be obtained not only when all the electrode fingers of the input and output side IDT 5 and 6 and the grating reflector 9 satisfy the conditions, but also when a part of the electrode fingers satisfies the conditions.

For example, a similar advantage can be obtained when a part of the electrode fingers 3 of the input side IDT 5 satisfies the conditions, i.e., when the cut angle θ of the LT substrate is set in the range of 34° to 41°, the electrode thickness of a part of the electrode fingers 3 of the input side IDT 5 is set in the range of 0.01 to 0.05 with respect to a wavelength of SAW, and the duty ratio (w/p) of a part of the electrode fingers 3 thereof is set to the value ranging from 0.6 to just below 1.0.

Similarly, a similar advantage can be obtained when a part of the electrode fingers 3 of the output side IDT 6 satisfies the conditions, i.e., when the cut angle θ of the LT substrate is set in the range of 34° to 41°, and the electrode thickness of a part of the electrode fingers 3 of the output side IDT 6 is set in the range of 0.01 to 0.05 with respect to a wavelength of SAW, and the duty ratio (w/p) of a part of the electrode fingers 3 thereof is set to the value ranging from 0.6 to just below 1.0.

Likewise, a similar advantage can be obtained when a part of the electrode fingers 10 of the grating reflector 9 satisfies the conditions, i.e., when the cut angle θ of the LT substrate is set in the range of 34° to 41°, the electrode thickness of a part of the electrode fingers 10 of the grating reflector 9 is set in the range of 0.01 to 0.05 with respect to a wavelength of SAW, and the duty ratio (w/p) of a part of the electrode fingers 10 thereof is set to the value ranging from 0.6 to just below 1.0.

Furthermore, the foregoing advantage can obtained not only when all portions of a part of the electrode fingers of the input and output side IDT 5 and 6 and the grating reflector 9 satisfy the conditions, but also when only a portion thereof satisfies the conditions.

For example, a similar advantage can be obtained when only a portion of a part of the electrode fingers 3 of the input side IDT 5 satisfies the conditions, i.e., when the cut angle θ of the LT substrate is set in the range of 34° to 41°, the electrode thickness of a portion of a part of the electrode fingers 3 of the input side IDT 5 is set in the range of 0.01 to 0.05 with respect to a wavelength of SAW, and the duty ratio (w/p) of a portion of a part of the electrode fingers 3 thereof is set to the value ranging from 0.6 to just below 1.0.

Similarly, a similar advantage can be obtained when only a portion of a part of the electrode fingers 3 of the output side IDT 6 satisfies the conditions, i.e., when the cut angle θ of the LT substrate is set in the range of 34° to 41°, the electrode thickness of a portion of a part of the electrode fingers 3 of the output side IDT 6 is set in the range of 0.01 to 0.05 with respect to a wavelength of SAW, and the duty ratio (w/p) of a portion of a part of the electrode fingers 3 thereof is set to the value ranging from 0.6 to just below 1.0.

Likewise, a similar advantage can be obtained when only a portion of a part of the electrode fingers 10 of the grating reflector 9 satisfies the conditions, i.e., when the cut angle θ of the LT substrate is set in the range of 34° to 41°, the electrode thickness of a portion of a part of the electrode fingers 10 of the grating reflector 9 is set in the range of 0.01 to 0.05 with respect to a wavelength of SAW, and the duty ratio (w/p) of a portion of a part of the electrode fingers 10 thereof is set to the value ranging from 0.6 to just below 1.0.

[Second Embodiment]

As shown in FIG. 6, the attenuation constant α takes a minimum value when the cut angle θ is about 38° and, by setting the cut angle θ in the range of 35° to 41°, the attenuation constant α can be limited to 0.005 (dB/λ). In addition, as shown in FIG. 8, the attenuation constant α takes a minimum value when the cut angle θ is about 39° and, by setting the cut angle θ in the range of 36° to 42°, the attenuation constant α can be limited to 0.005 (dB/λ).

As shown in FIGS. 7 and 9, when the cut angle θ is set in the range of 35° to 42°, and the duty ratio (w/p) is 0.6 or higher, the electromechanical coupling coefficient $k^2$ is larger than that in the conventional case in which the cut angle θ is 36° and the duty ratio (w/p) is 0.5. In the case having a large standardized electrode thickness (h/λ) shown in FIG. 9, compared with that shown in FIG. 7, the electromechanical coupling coefficient $k^2$ is larger under equal cut angles θ and equal duty ratios (w/p).

As described above, according to the second embodiment, the cut angle θ of the LT substrate is set in the range of 35° to 42°, the electrode thickness of each of the electrode fingers 3 and 10 respectively of the input and output side IDT 5 and 6 and the grating reflector 9 is set in the range of 0.05 to 0.075 with respect to a wavelength of SAW, and the duty ratio (w/p) of the electrode fingers 3 and 10 respectively of the input and output side IDT 5 and 6 and the grating reflector 9 is set to the value ranging from 0.6 to just below 1.0. Thus, it is possible to realize an acoustic wave apparatus with lower loss characteristics and wider band characteristics as compared with the conventional acoustic wave apparatus of such a type.

Such an advantage can be obtained not only when the input and output side IDT 5 and 6 and the grating reflector 9 all satisfy the foregoing conditions, but also when only one of the components satisfies the conditions.

For example, a similar advantage can be obtained when only the input side IDT 5 satisfies the conditions, i.e., when the cut angle θ of the LT substrate is set in the range of 35° to 42°, the electrode thickness of the electrode finger 3 of the input side IDT 5 is set in the range of 0.05 to 0.075 with respect to a wavelength of SAW, and the duty ratio (w/p) of the electrode finger 3 of the input side IDT 5 is set to the value ranging from 0.6 to just below 1.0.

Similarly, a similar advantage can be obtained when only the output side IDT 6 satisfies the conditions, i.e., when the cut angle θ of the LT substrate is set in the range of 35° to 42°, the electrode thickness of the electrode finger 3 of the output side IDT 6 is set in the range of 0.05 to 0.075 with respect to a wavelength of SAW, and the duty ratio (w/p) of the electrode finger 3 of the output side IDT 6 is set to the value ranging from 0.6 to just below 1.0.

Likewise, a similar advantage can be obtained when only the grating reflector 9 satisfies the conditions, i.e., when the cut angle θ of the LT substrate is set in the range of 35° to 42°, the electrode thickness of the electrode finger 10 of the grating reflector 9 is set in the range of 0.05 to 0.07 with respect to a wavelength of SAW, and the duty ratio (w/p) of the electrode finger 10 of the grating reflector 9 is set to the value ranging from 0.6 to just below 1.0.

In addition, the foregoing advantage can be obtained not only when all the electrode fingers of the input and output side IDT 5 and 6 and the grating reflector 9 satisfy the conditions, but also when a part of the electrode fingers satisfies the conditions.

For example, a similar advantage can be obtained when a part of the electrode fingers 3 of the input side IDT 5 satisfies the conditions, i.e., when the cut angle θ of the LT substrate is set in the range of 35° to 42°, the electrode thickness of a part of the electrode fingers 3 of the input side IDT 5 is set in the range of 0.05 to 0.075 with respect to a wavelength of SAW, and the duty ratio (w/p) of a part of the electrode fingers 3 thereof is set to the value ranging from 0.6 to just below 1.0.

Similarly, a similar advantage can be obtained when a part of the electrode fingers 3 of the output side IDT 6 satisfies the conditions, i.e., when the cut angle θ of the LT substrate is set in the range of 35° to 42°, the electrode thickness of a part of the electrode fingers 3 of the output side IDT 6 is set in the range of 0.05 to 0.075 with respect to a wavelength of SAW, and the duty ratio (w/p) of a part of the electrode fingers 3 thereof is set to the value ranging from 0.6 to just below 1.0.

Likewise, a similar advantage can be obtained when a part of the electrode fingers 10 of the grating reflector 9 satisfies the conditions, i.e., when the cut angle θ of the LT substrate is set in the range of 35° to 42°, the electrode thickness of a part of the electrode fingers 10 of the grating reflector 9 is set in the range of 0.05 to 0.075 with respect to a wavelength of SAW, and the duty ratio (w/p) of a part of the electrode fingers 10 thereof is set to the value ranging from 0.6 to just below 1.0.

Furthermore, the foregoing advantage can be obtained not only when all portions of a part of the electrode fingers of the input and output side IDT 5 and 6 and the grating reflector 9 satisfy the conditions, but also when only a portion thereof satisfies the conditions.

For example, a similar advantage can be obtained when only a portion of a part of the electrode fingers 3 of the input side IDT 5 satisfies the conditions, i.e., when the cut angle θ of the LT substrate is set in the range of 35° to 42°, the electrode thickness of a portion of a part of the electrode fingers 3 of the input side IDT 5 is set in the range of 0.05 to 0.075 with respect to a wavelength of SAW, and the duty ratio (w/p) of a portion of a part of the electrode fingers 3 thereof is set to the value ranging from 0.6 to just below 1.0.

Similarly, a similar advantage can be obtained when only a portion of a part of the electrode fingers 3 of the output side IDT 6 satisfies the conditions, i.e., when the cut angle θ of the LT substrate is set in the range of 35° to 42°, the electrode thickness of a portion of a part of the electrode fingers 3 of the output side IDT 6 is set in the range of 0.05 to 0.075 with respect to a wavelength of SAW, and the duty ratio (w/p) of a portion of a part of the electrode fingers 3 thereof is set to the value ranging from 0.6 to just below 1.0.

Likewise, a similar advantage can be obtained when only a portion of a part of the electrode fingers 10 of the grating reflector 9 satisfies the conditions, i.e., when the cut angle θ of the LT substrate is set in the range of 35° to 42°, the electrode thickness of a portion of a part of the electrode fingers 10 of the grating reflector 9 is set in the range of 0.05 to 0.075 with respect to a wavelength of SAW, and the duty ratio (w/p) of a portion of a part of the electrode fingers 10 thereof is set to the value ranging from 0.6 to just below 1.0.
[Third Embodiment]

As shown in FIG. 8, the attenuation constant α takes a minimum value when the cut angle θ is about 39° and, by setting the cut angle θ in the range of 36° to 42°, the attenuation constant α can be limited to 0.005 (dB/λ). In addition, as shown in FIG. 10, the attenuation constant α takes a minimum value when the cut angle θ is about 40° and, by setting the cut angle θ in the range of 37° to 43°, the attenuation constant α can be limited to 0.005 (dB/λ).

As shown in FIGS. 9 and 11, when the cut angle θ is set in the range of 36° to 43°, and the duty ratio (w/p) is 0.6 or higher, the electromechanical coupling coefficient $k^2$ is larger than that in the conventional case in which the cut angle θ is 36° and the duty ratio (w/p) is 0.5. In the case having a large standardized electrode thickness (h/λ) shown in FIG. 11, compared with that shown in FIG. 9, the electromechanical coupling coefficient $k^2$ is larger under equal cut angles θ and equal duty ratios (w/p).

As described above, according to the third embodiment, the cut angle θ of the LT substrate is set in the range of 36° to 43°, the electrode thickness of each of the electrode fingers 3 and 10 respectively of the input and output side IDT 5 and 6 and the grating reflector 9 is set in the range of 0.075 to 0.1 with respect to a wavelength of SAW, and the duty ratio (w/p) of the electrode fingers 3 and 10 respectively of the input and output side IDT 5 and 6 and the grating reflector 9 is set to the value ranging from 0.6 upto just below 1.0. Thus, it is possible to realize an acoustic wave apparatus with lower loss characteristics and wider band characteristics as compared with the conventional acoustic wave apparatus of such a type.

Such an advantage can be obtained not only when the input and output side IDT 5 and 6 and the grating reflector 9 all satisfy the foregoing conditions, but also when only one of the components satisfies the conditions.

For example, a similar advantage can be obtained when only the input side IDT 5 satisfies the conditions, i.e., when the cut angle θ of the LT substrate is set in the range of 36° to 43°, the electrode thickness of the electrode finger 3 of the input side IDT 5 is set in the range of 0.075 to 0.1 with respect to a wavelength of SAW, and the duty ratio (w/p) of the electrode finger 3 of the input side IDT 5 is set to the value ranging from 0.6 to just below 1.0.

Similarly, a similar advantage can be obtained when only the output side IDT 6 satisfies the conditions, i.e., when the cut angle θ of the LT substrate is set in the range of 36° to 43°, the electrode thickness of the electrode finger 3 of the output side IDT 6 is set in the range of 0.075 to 0.1 with respect to a wavelength of SAW, and the duty ratio (w/p) of the electrode finger 3 of the output side IDT 6 is set to the value ranging from 0.6 to just below 1.0.

Likewise, a similar advantage can be obtained when only the grating reflector 9 satisfies the conditions, i.e., when the cut angle θ of the LT substrate is set in the range of 36° to 43°, the electrode thickness of the electrode finger 10 of the grating reflector 9 is set in the range of 0.075 to 0.1 with respect to a wavelength of SAW, and the duty ratio (w/p) of the electrode finger 10 of the grating reflector 9 is set to the value ranging from 0.6 to just below 1.0.

In addition, the foregoing advantage can be obtained not only when all the electrode fingers of the input and output side IDT 5 and 6 and the grating reflector 9 satisfy the conditions, but also when a part of the electrode fingers satisfies the conditions.

For example, a similar advantage can be obtained when a part of the electrode fingers 3 of the input side IDT 5 satisfies the conditions, i.e., when the cut angle θ of the LT substrate is set in the range of 36° to 43°, the electrode thickness of a part of the electrode fingers 3 of the input side IDT 5 is set in the range of 0.075 to 0.1 with respect to a wavelength of SAW, and the duty ratio (w/p) of a part of the electrode fingers 3 thereof is set to the value ranging from 0.6 to just below 1.0.

Similarly, a similar advantage can be obtained when a part of the electrode fingers 3 of the output side IDT 6 satisfies the conditions, i.e., when the cut angle θ of the LT substrate is set in the range of 36° to 43°, the electrode thickness of a part of the electrode fingers 3 of the output side IDT 6 is set in the range of 0.075 to 0.1 with respect to a wavelength of SAW, and the duty ratio (w/p) of a part of the electrode fingers 3 thereof is set to the value ranging from 0.6 to just below 1.0.

Likewise, a similar advantage can be obtained when a part of the electrode fingers 10 of the grating reflector 9 satisfies the conditions, i.e., when the cut angle θ of the LT substrate is set in the range of 36° to 43°, the electrode thickness of a part of the electrode fingers 10 of the grating reflector 9 is set in the range of 0.075 to 0.1 with respect to a wavelength of SAW, and the duty ratio (w/p) of a part of the electrode fingers 10 thereof is set to the value ranging from 0.6 to just below 1.0.

In addition, the foregoing advantage can be obtained not only when all portions of a part of the electrode fingers of the input and output side IDT 5 and 6 and the grating reflector 9, but also when only a portion thereof satisfies the conditions.

For example, a similar advantage can be obtained when only a portion of a part of the electrode fingers 3 of the input side IDT 5 satisfies the conditions, i.e., when the cut angle θ of the LT substrate is set in the range of 36° to 43°, the electrode thickness of a portion of a part of the electrode fingers 3 of the input side IDT 5 is set in the range of 0.075 to 0.1 with respect to a wavelength of SAW, and the duty ratio (w/p) of a portion of a part of the electrode fingers 3 thereof is set to the value ranging from 0.6 to just below 1.0.

Similarly, a similar advantage can be obtained when only a portion of a part of the electrode fingers 3 of the output side IDT 6 satisfies the conditions, i.e., when the cut angle θ of the LT substrate is set in the range of 36° to 43°, the electrode thickness of a portion of a part of the electrode fingers 3 of the output side IDT 6 is set in the range of 0.075 to 0.1 with respect to a wavelength of SAW, and the duty ratio (w/p) of a portion of a part of the electrode fingers 3 thereof is set to the value ranging from 0.6 to just below 1.0.

Likewise, a similar advantage can be obtained when only a portion of a part of the electrode fingers 10 of the grating reflector 9 satisfies the conditions, i.e., when the cut angle θ of the LT substrate is set in the range of 36° to 43°, the electrode thickness of a portion of a part of the electrode fingers 10 of the grating reflector 9 is set in the range of 0.075 to 0.1 with respect to a wavelength of SAW, and the duty ratio (w/p) of a portion of a part of the electrode fingers 10 thereof is set to the value ranging from 0.6 to just below 1.0.

Figure 2:
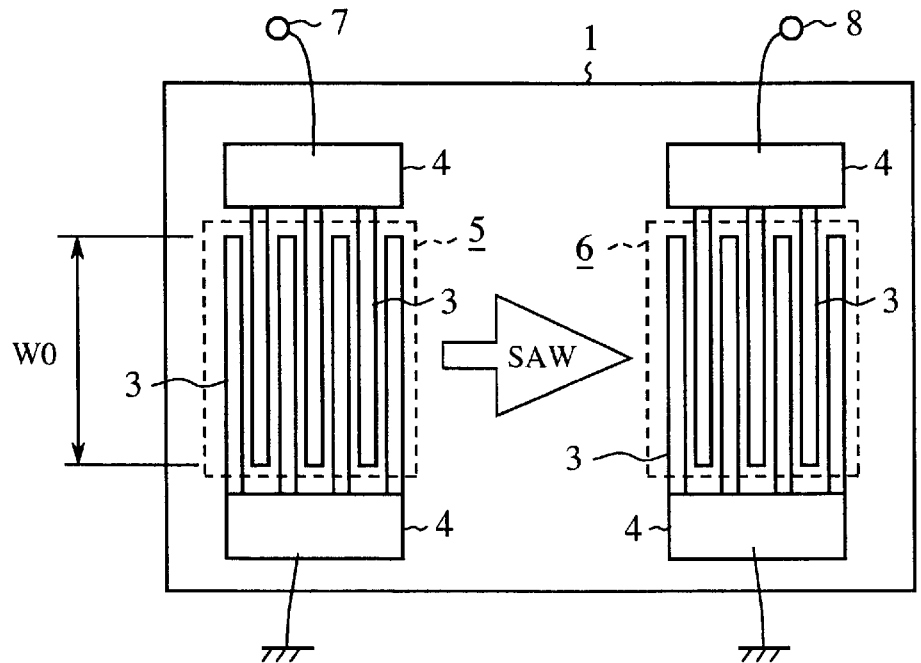
FIG. 2 is an upper surface view showing a constitution of an SAW filter.

The invention has been described by taking the example of the mode-coupled SAW resonant filter shown in FIG. 12. However, the invention is not limited to such, and a similar advantage can be obtained even when a given number of IDT units other than 3 is prepared. Further, the invention is similarly advantageous even when it is applied to a so-called transversal filter having a multielectrode structure or the simply structured SAW filter shown in FIG. 2.

In addition, in the foregoing cases, the arraying cycles of the electrode fingers 3 were all similar. However, the invention is similarly advantageous even when the arraying cycles are partially or entirely changed. A similar advantage can also be obtained even in the case where there is a floating electrode in the IDT or floating electrodes present at different positions in the IDT are electrically connected to each other.

Furthermore, the present invention is advantageous not only for the SAW filter but also for all the other types of SAW devices including IDT having a function of conversion for the electric signal of a one terminal pair SAW resonator, a SAW delay line, a SAW dispersed delay line, a SAW convolver or the like with LSAW and SSBW. The invention is also advantageous for all acoustic wave apparatus using such SAW devices.

Industrial applicability

As apparent from the foregoing, the acoustic wave apparatus of the invention is suitable for realizing a characteristic of smaller loss and a wider band than those in the conventional art.

What is claimed is:

1. An acoustic wave apparatus comprising:

a piezoelectric substrate mainly containing lithium tantalate;

an interdigital transducer including a conductor formed on said substrate; and a reflector including a conductor formed on said substrate, wherein a surface rotated in a range of 34° to 41° from a crystal Y axis around a crystal X axis of the lithium tantalate is set as a surface of said substrate, a standardized electrode thickness (h/λ) obtained by standardizing a thickness h of an electrode finger constituting at least a part of said reflector by a wavelength λ of a surface acoustic wave is set in a range of 0.01 to 0.05, and a duty ratio (w/p) of the electrode finger decided based on a width w and an arraying cycle p of the electrode finger is set to the value ranging from 0.6 to just below 1.0.

2. An acoustic wave apparatus comprising:

a piezoelectric substrate mainly containing lithium tantalate;

an interdigital transducer including a conductor formed on said substrate; and a reflector including a conductor formed on said substrate, wherein a surface rotated in a range of 35° to 42° from a crystal Y axis around a crystal X axis of the lithium tantalate is set as a surface of said substrate, a standardized electrode thickness (h/λ) obtained by standardizing a thickness h of an electrode finger constituting at least a part of said reflector by a wavelength λ of a surface acoustic wave is set in a range of 0.05 to 0.075, and a duty ratio (w/p) of the electrode finger decided based on a width w and an arraying cycle p of the electrode finger is set to the value ranging from 0.6 to just below 1.0.

3. An acoustic wave apparatus comprising:

a piezoelectric substrate mainly containing lithium tantalate;

an interdigital transducer including a conductor formed on said substrate; and a reflector including a conductor formed on said substrate, wherein a surface rotated in a range of 36° to 43° from a crystal Y axis around a crystal X axis of the lithium tantalate is set as a surface of said substrate, a standardized electrode thickness (h/λ) obtained by standardizing a thickness h of an electrode finger constituting at least a part of said reflector by a wavelength λ of a surface acoustic wave is set in a range of 0.075 to 0.1, and a duty ratio (w/p) of the electrode finger decided based on a width w and an arraying cycle p of the electrode finger is set to the value ranging from 0.6 to just below 1.0.

4. An acoustic wave apparatus comprising:

a piezoelectric substrate mainly containing lithium tantalate;

an interdigital transducer including a conductor formed on said substrate; and a reflector including a conductor formed on said substrate, wherein a surface rotated in a range of 34° to 41° from a crystal Y axis around a crystal X axis of the lithium tantalate is set as a surface of said substrate, a standardized electrode thickness (h/λ) obtained by standardizing a thickness h of a part of an electrode finger constituting a part of said reflector by a wavelength λ of a surface acoustic wave is set in a range of 0.01 to 0.05, and a duty ratio (w/p) of a part of the electrode finger decided based on a width w and an arraying cycle p of a part of the electrode finger is set to the value ranging from 0.6 to just below 1.0.

5. An acoustic wave apparatus comprising:

a piezoelectric substrate mainly containing lithium tantalate;

an interdigital transducer including a conductor formed on said substrate; and a reflector including a conductor formed on said substrate, wherein a surface rotated in a range of 35° to 42° from a crystal Y axis around a crystal X axis of the lithium tantalate is set as a surface of said substrate, a standardized electrode thickness (h/λ) obtained by standardizing a thickness h of a part of an electrode finger constituting a part of said reflector by a wavelength λ of a surface acoustic wave is set in a range of 0.05 to 0.075, and a duty ratio (w/p) of a part of the electrode finger decided based on a width w and an arranging cyce of a part of the electrode finger is set to the value ranging from 0.6 to just below 1.0.

6. An acoustic wave apparatus comprising:

a piezoelectric substrate mainly containing lithium tantalate;

an interdigital transducer induding a conductor formed on said substrate; and a reflector including a conductor formed on said substrate, wherein a surface rotated in a range of 36° to 43° from a crystal Y axis around a crystal X axis of the lithium tantalate is set as a surface of said substrate, a standardized electrode thickness (h/λ) obtained by standardizing a thickness h of a part of an electrode finger constituting a part of said reflector by a wavelength λ of a surface acoustic wave is set in a range of 0.075 to 0.1, and a duty ratio (w/p) of a part of the electrode finger decided based on a width w and an arraying cycle p of a part of the electrode finger is set to the value ranging from 0.6 to just below 1.0.

\* \* \* \* \*